(12) United States Patent
Lee et al.

(10) Patent No.: US 7,078,308 B2
(45) Date of Patent: Jul. 18, 2006

(54) METHOD AND APPARATUS FOR REMOVING ADJACENT CONDUCTIVE AND NONCONDUCTIVE MATERIALS OF A MICROELECTRONIC SUBSTRATE

(75) Inventors: Whonchee Lee, Boise, ID (US); Scott G. Meikle, Gainesville, VA (US); Guy Blalock, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 212 days.

(21) Appl. No.: 10/230,628

(22) Filed: Aug. 29, 2002

(65) Prior Publication Data

US 2004/0043629 A1    Mar. 4, 2004

(51) Int. Cl.
H01L 21/8242    (2006.01)

(52) U.S. Cl. ................................. 438/387; 438/397

(58) Field of Classification Search ............... 438/238, 438/239, 243, 244, 386, 387, 396, 397
See application file for complete search history.

(56) References Cited

U.S. PATENT DOCUMENTS

| | | | |
|---|---|---|---|
| 2,315,695 A | 4/1943 | Faust | |
| 2,516,105 A | 7/1950 | der Mateosian | |
| 3,239,439 A | 3/1966 | Helmke | |
| 3,334,210 A | 8/1967 | Williams et al. | |
| 4,839,005 A | 6/1989 | Katsumoto et al. | |
| 5,098,533 A | 3/1992 | Duke et al. | |
| 5,162,248 A * | 11/1992 | Dennison et al. | 438/396 |
| 5,244,534 A | 9/1993 | Yu et al. | |
| 5,300,155 A | 4/1994 | Sandhu et al. | |
| 5,344,539 A | 9/1994 | Shinogi et al. | |
| 5,562,529 A | 10/1996 | Kishii et al. | |
| 5,567,300 A | 10/1996 | Datta et al. | |
| 5,575,885 A | 11/1996 | Hirabayashi et al. | |
| 5,618,381 A | 4/1997 | Doan et al. | |
| 5,624,300 A | 4/1997 | Kishii et al. | |
| 5,676,587 A | 10/1997 | Landers et al. | |

(Continued)

FOREIGN PATENT DOCUMENTS

EP    0459397 A2    12/1991

(Continued)

OTHER PUBLICATIONS

U.S. Appl. No. 09/651,779, filed Aug. 30, 2000, Moore.

(Continued)

*Primary Examiner*—Anh Duy Mai
(74) *Attorney, Agent, or Firm*—Perkins Coie LLP

(57) ABSTRACT

A microelectronic substrate and method for removing adjacent conductive and nonconductive materials from a microelectronic substrate. In one embodiment, the microelectronic substrate includes a substrate material (such as borophosphosilicate glass) having an aperture with a conductive material (such as platinum) disposed in the aperture and a fill material (such as phosphosilicate glass) in the aperture adjacent to the conductive material. The fill material can have a hardness of about 0.04 GPa or higher, and a microelectronics structure, such as an electrode, can be disposed in the aperture, for example, after removing the fill material from the aperture. Portions of the conductive and fill material external to the aperture can be removed by chemically-mechanically polishing the fill material, recessing the fill material inwardly from the conductive material, and electrochemically-mechanically polishing the conductive material. The hard fill material can resist penetration by conductive particles, and recessing the fill material can provide for more complete removal of the conductive material external to the aperture.

28 Claims, 6 Drawing Sheets

U.S. PATENT DOCUMENTS

| | | | |
|---|---|---|---|
| 5,681,423 A | 10/1997 | Sandhu et al. | |
| 5,780,358 A | 7/1998 | Zhou et al. | |
| 5,807,165 A | 9/1998 | Uzoh et al. | |
| 5,840,629 A | 11/1998 | Carpio | |
| 5,843,818 A * | 12/1998 | Joo et al. | 438/240 |
| 5,846,398 A | 12/1998 | Carpio | |
| 5,863,307 A | 1/1999 | Zhou et al. | |
| 5,888,866 A * | 3/1999 | Chien | 438/254 |
| 5,897,375 A | 4/1999 | Watts et al. | |
| 5,911,619 A | 6/1999 | Uzoh et al. | |
| 5,930,699 A | 7/1999 | Bhatia | |
| 5,934,980 A | 8/1999 | Koos et al. | |
| 5,952,687 A | 9/1999 | Kawakubo et al. | |
| 5,954,975 A | 9/1999 | Cadien et al. | |
| 5,954,997 A | 9/1999 | Kaufman et al. | |
| 5,972,792 A | 10/1999 | Hudson | |
| 5,993,637 A | 11/1999 | Hisamatsu et al. | |
| 6,001,730 A | 12/1999 | Farkas et al. | |
| 6,007,695 A | 12/1999 | Knall et al. | |
| 6,010,964 A | 1/2000 | Glass | |
| 6,024,856 A | 2/2000 | Haydu et al. | |
| 6,033,953 A | 3/2000 | Aoki et al. | |
| 6,039,633 A | 3/2000 | Chopra | |
| 6,046,099 A | 4/2000 | Cadien et al. | |
| 6,051,496 A | 4/2000 | Jang | |
| 6,060,386 A | 5/2000 | Givens | |
| 6,060,395 A | 5/2000 | Skrovan et al. | |
| 6,063,306 A | 5/2000 | Kaufman et al. | |
| 6,066,030 A | 5/2000 | Uzoh | |
| 6,066,559 A | 5/2000 | Gonzalez et al. | |
| 6,068,787 A | 5/2000 | Grumbine et al. | |
| 6,083,840 A | 7/2000 | Mravic, et al. | |
| 6,100,197 A | 8/2000 | Hasegawa | |
| 6,103,096 A | 8/2000 | Datta et al. | |
| 6,103,628 A | 8/2000 | Talieh | |
| 6,103,636 A | 8/2000 | Zahorik, et al. | |
| 6,115,233 A | 9/2000 | Seliskar et al. | |
| 6,117,781 A | 9/2000 | Lukanc et al. | |
| 6,121,152 A | 9/2000 | Adams et al. | |
| 6,132,586 A | 10/2000 | Adams et al. | |
| 6,143,155 A | 11/2000 | Adams et al. | |
| 6,162,681 A * | 12/2000 | Wu | 438/256 |
| 6,171,467 B1 | 1/2001 | Weihs et al. | |
| 6,174,425 B1 | 1/2001 | Simpson et al. | |
| 6,176,992 B1 | 1/2001 | Talieh | |
| 6,180,947 B1 | 1/2001 | Stickel et al. | |
| 6,187,651 B1 | 2/2001 | Oh | |
| 6,190,494 B1 | 2/2001 | Dow | |
| 6,196,899 B1 | 3/2001 | Chopra et al. | |
| 6,197,182 B1 | 3/2001 | Kaufman et al. | |
| 6,206,756 B1 | 3/2001 | Chopra et al. | |
| 6,218,309 B1 | 4/2001 | Miller et al. | |
| 6,250,994 B1 | 6/2001 | Chopra et al. | |
| 6,259,128 B1 | 7/2001 | Adler et al. | |
| 6,273,786 B1 | 8/2001 | Chopra et al. | |
| 6,276,996 B1 | 8/2001 | Chopra | |
| 6,280,581 B1 | 8/2001 | Cheng | |
| 6,287,974 B1 | 9/2001 | Miller | |
| 6,299,741 B1 | 10/2001 | Sun et al. | |
| 6,313,038 B1 | 11/2001 | Chopra et al. | |
| 6,322,422 B1 | 11/2001 | Satou | |
| 6,328,632 B1 | 12/2001 | Chopra | |
| 6,368,184 B1 | 4/2002 | Beckage | |
| 6,368,190 B1 | 4/2002 | Easter et al. | |
| 6,379,223 B1 | 4/2002 | Sun et al. | |
| 6,395,607 B1 | 5/2002 | Chung | |
| 6,416,647 B1 | 7/2002 | Dordi et al. | |
| 6,455,370 B1 * | 9/2002 | Lane | 438/253 |
| 6,461,911 B1 * | 10/2002 | Ahn et al. | 438/253 |
| 6,464,855 B1 | 10/2002 | Chadda et al. | |
| 6,852,630 B1 | 10/2002 | Basol et al. | |
| 6,504,247 B1 | 1/2003 | Chung | |
| 6,867,136 B1 | 6/2003 | Basol et al. | |
| 6,620,037 B1 | 9/2003 | Kaufman et al. | |
| 6,689,258 B1 | 2/2004 | Lansford et al. | |
| 6,693,036 B1 | 2/2004 | Nogami et al. | |
| 6,848,970 B1 | 3/2004 | Manens et al. | |
| 6,722,942 B1 | 4/2004 | Lansford et al. | |
| 6,753,250 B1 | 6/2004 | Hill et al. | |
| 6,776,693 B1 | 8/2004 | Duboust et al. | |
| 6,780,772 B1 | 8/2004 | Uzoh et al. | |
| 6,893,328 B1 | 10/2004 | So | |
| 6,881,664 B1 | 4/2005 | Catabay et al. | |
| 2001/0025976 A1 | 10/2001 | Sandhu et al. | |
| 2001/0036746 A1 | 11/2001 | Sato et al. | |
| 2002/0025759 A1 | 2/2002 | Lee et al. | |
| 2002/0025760 A1 | 2/2002 | Lee et al. | |
| 2002/0025763 A1 | 2/2002 | Lee et al. | |
| 2002/0052126 A1 | 5/2002 | Lee et al. | |
| 2002/0070126 A1 | 6/2002 | Sato et al. | |
| 2002/0104764 A1 | 8/2002 | Banerjee et al. | |
| 2002/0108861 A1 * | 8/2002 | Emesh et al. | 205/81 |
| 2002/0115283 A1 | 8/2002 | Ho et al. | |
| 2003/0064669 A1 | 4/2003 | Basol et al. | |
| 2003/0109198 A1 * | 6/2003 | Lee et al. | 451/8 |
| 2003/0178320 A1 | 9/2003 | Liu et al. | |
| 2004/0043705 A1 * | 3/2004 | Lee et al. | 451/41 |
| 2004/0192052 A1 | 9/2004 | Mukherjee et al. | |
| 2004/0259479 A1 | 12/2004 | Sevilla | |
| 2005/0059324 A1 | 3/2005 | Lee et al. | |
| 2005/0133379 A1 | 6/2005 | Basol et al. | |
| 2005/0173260 A1 | 8/2005 | Basol et al. | |
| 2005/0178743 A1 | 8/2005 | Manens et al. | |

FOREIGN PATENT DOCUMENTS

| | | |
|---|---|---|
| EP | 0459397 A3 | 12/1991 |
| EP | EP 1 123 956 A1 | 8/2001 |
| JP | 1-241129 A | 9/1989 |
| JP | 2001077117 A1 | 3/2001 |
| JP | JP 2001077117 A1 | 3/2001 |
| WO | WO 00/26443 A2 | 5/2000 |
| WO | WO 00/26443 A3 | 5/2000 |
| WO | WO 00/28586 A2 | 5/2000 |
| WO | WO 00/28586 A3 | 5/2000 |
| WO | WO 00/32356 A1 | 6/2000 |
| WO | WO 00/59008 A2 | 10/2000 |
| WO | WO 00/59008 A3 | 10/2000 |
| WO | WO 00/59682 A1 | 10/2000 |
| WO | WO 02/064314 A1 | 8/2002 |

OTHER PUBLICATIONS

U.S. Appl. No. 09/651,808, filed Aug. 30, 2000, Chopra et al.
U.S. Appl. No. 09/653,392, filed Aug. 31, 2000, Chopra et al.
U.S. Appl. No. 10/090,869, filed Mar. 4, 2002, Moore et al.
U.S. Appl. No. 10/230,463, filed Aug. 29, 2002, Lee et al.
U.S. Appl. No. 10/230,973, filed Aug. 29, 2002, Chopra.
U.S. Appl. No. 10/230,602, filed Aug. 29, 2002, Chopra.
U.S. Appl. No. 10/230,970, filed Aug. 29, 2002, Lee et al.
U.S. Appl. No. 10/230,972, filed Aug. 29, 2002, Lee et al.
D'Heurle, F. M. and K.C. Park, IBM Technical Disclosure Bulletin, Electrolytic Process for Metal Pattern Generation, vol. 17, No. 1, pp. 271-272, Jun. 1974, XP-002235692, NN 7406271.
Frankenthal, R.P. and Eaton, D. H., "Electroetching of Platinum in the Titanium-Platinum-Gold Metallization on Silicon Integrated Circuits," Journal of The Electrochemical Society, Vol. 123, No. 5, pp. 703-706, May 1976, Pennington, New Jersey.

Aboaf, J.A. and R. W. Broadie, IBM Technical Disclosure Bulletin, Rounding of Square-Shape Holes in Silicon Wafers, vol. 19, No. 8, p. 3042, Jan. 1977, XP-002235690, NN 77013042.

Bassous, E., IBM Technical Disclosure Bulletin, Low Temperature Methods for Rounding Silicon Nozzles, Vol. 20, No. 2, Jul. 1977, pp. 810-811, XP-002235692, NN7707810.

PCT International Search Report dated Dec. 1, 2003 for PCT/US03/27181 filed Aug.27,2003 (7pages).

JUCHNIEWICZ, R. et al." Influence of Pulsed Current on Platinised Titanium and Tantalum Anode Durability," International Congress on Metallic Corrosion, Proceedings — vol. 3, pp. 449-453, Toronto, Jun. 3-7, 1984.

U.S. Appl. No. 09/653,411, filed, Aug. 31, 2000, Lee et al.

PCT Written opinion dated Jun. 10, 2003 for PCT/US02/19495 filed Jun. 20, 2002 (7 pages).

PCT Written opinion dated Jun. 10, 2003 for PCT/US02/19496 filed Jun. 20, 2002 (8 pages).

PCT International Search Report dated Jul. 10, 2003 for PCT/US03/06373 filed Feb. 28, 2003 (4 pages).

BERNHARDT, A.F., R.J. CONTOLINI,and S.T. MAYER, "Electrochemical Planarization for Multi-level Metallization of Microcircuitry," CircuiTree, vol. 8, No. 10, pp. 38, 40, 42, 44, 46, and 48, Oct. 1995.

McGRAW-HILL, "Chemical bonding," Concise Encyclopedia of Science & Technology, Fourth Edition, Sybil P. Parker, Editor in Chief, p. 367, McGraw-Hill, New York, New York, 1998.

PhysicsWorld. Hard Materials (excerpt of Superhard Superlattices ) [online]. S. Barnett and A. Madan, Physics World, Jan. 1998, Institute of Physics Publishing Ltd., Bristol, United Kingdom. Retrieved from the Internet on Jul. 29, 2002. <URL: http://physicsweb.org/box/world/11/1/11/world-11-1-11-1>.

HUANG, C.S. et al., "A Novel UV Baking Process to Improve DUV Photoresist Hardness," pp. 135-138, Proceedings of the 1999 International Symposium on VLSI Technology, Systems, and Applications: Proceedings of Technical Papers: Jun. 8-10, 1999, Taipei, Taiwan, Institute of Electrical and Electronics Engineers, Inc., Sep. 1999.

ATMI, Inc., Internal document, adapted from a presentation at the Semicon West '99 Low Dielectric Materials Technology Conference, San Francisco, California, Jul. 12, 1999, pp. 13-25.

KONDO, S. et al., "Abrasive-Free Polishing for Copper Damascene Interconnection," Journal of the Electrochemical Society, vol. 147, No. 10, pp. 3907-3913, The Electrochemical Society, Inc., Pennington, New Jersey, 2000.

Micro Photonics, Inc. CSM Application Bulletin. Low-load Micro Scratch Tester (MST) for Characterisation of thin polymer films [ online] 3 pages. Retrieved from the Internet on Jul. 25, 2002. <URL: http://www.microphotonics.com/mstABpoly.html>.

Micro Photonics, Inc. CSM Nano Hardness Tester online. 6pages. Retrieved from the internet on Jul. 29, 2002. <URL: http://www.microphotonics.com/nht.html>.

PCT International Search Report, International Application Number PCT/US02/19495, Mar. 31, 2003.

PCT International Search Report, International Application Number PCT/US02/19496, Apr. 4, 2003.

* cited by examiner

METHOD AND APPARATUS FOR REMOVING ADJACENT CONDUCTIVE AND NONCONDUCTIVE MATERIALS OF A MICROELECTRONIC SUBSTRATE

CROSS-REFERENCE TO RELATED APPLICATIONS

This application is related to the following pending U.S. patent applications, all of which are incorporated herein by reference: Ser. No. 09/651,779, filed Aug. 30, 2000; Ser. No. 09/888,084, filed Jun. 21, 2001; Ser. No. 09/887,767, filed Jun. 21, 2001; and Ser. No. 09/888,002, filed Jun. 21, 2001. This application is also related to the following U.S. patent applications, filed simultaneously herewith and incorporated herein by reference: Ser. No 10/230,970; Ser. No. 10/230,972; Ser. No. 10/230,973; and Ser. No. 10/230,463.

TECHNICAL FIELD

The present invention relates generally to methods and apparatuses for removing adjacent conductive and nonconductive materials of a microelectronic substrate.

BACKGROUND

Microelectronic substrates and substrate assemblies typically include a semiconductor material having features, such as memory cells, that are linked with conductive lines. The conductive lines can be formed by first forming trenches or other recesses in the semiconductor material and then overlaying a conductive material (such as a metal) in the trenches. The conductive material is then selectively removed to leave conductive lines extending from one feature in the semiconductor material to another.

One technique for forming microelectronic features, such as capacitors, is to dispose the features in isolated containers within the microelectronic substrate. One typical process includes forming an aperture in a substrate material (such as borophosphosilicate glass or BPSG), coating the microelectronic substrate (including the walls of the aperture) first with a barrier layer and then with a conductive layer, and then overfilling the aperture with a generally nonconductive material, such as a photoresist material. The excess photoresist material, conductive layer material, and barrier layer material located external to the aperture are then removed using chemical-mechanical planarization or polishing (CMP). The capacitor is then disposed within the photoresist material in the aperture and coupled to other features of the microelectronic substrate with an overlying network of vias and lines.

One drawback with the foregoing container technique for forming capacitors is that during the CMP process, small particles of the conductive material removed from the conductive layer can become embedded in the photoresist material within the aperture. The embedded conductive material can cause short circuits and/or other defects in the capacitor that is subsequently formed in the aperture, causing the capacitor to fail.

SUMMARY

The present invention is directed toward methods and apparatuses for removing adjacent conductive and nonconductive materials of a microelectronic substrate. A method in accordance with one aspect of the invention includes forming an aperture in a microelectronic substrate material, disposing a conductive material in the aperture proximate to a wall of the aperture, and disposing a fill material in the aperture proximate to the conductive material. In one aspect of this embodiment, the fill material has a hardness of about 0.04 GPa or higher, and in another aspect of the invention, the fill material has a hardness of about 6.5 GPa or higher. For example, the fill material can include a phosphosilicate glass or a spin-on glass. A microelectronic feature, such as an electrode, can then be disposed in the aperture.

A method in accordance with another aspect of the invention includes providing a microelectronic substrate having a substrate material defining a substrate material plane, a conductive material proximate to the substrate material, and a generally nonconductive material proximate to the conductive material. The conductive material is accordingly positioned between the substrate material and the generally nonconductive material. A portion of the generally nonconductive material includes a first external portion projecting beyond the substrate material plane, and a portion of the conductive material includes a second external portion projecting beyond the substrate material plane. At least part of the first external portion extending beyond the second external portion is removed, and the fill material is recessed inwardly toward the substrate material plane. At least part of the second external portion is also removed. For example, the first external portion can be removed via chemical-mechanical polishing, and the second external portion can be removed via electrochemical-mechanical polishing. In a further aspect of the invention, the first external portion can be recessed until it extends outwardly from the substrate material plane by distance from about 200 Å to about 500 Å.

DETAILED DESCRIPTION

The present disclosure describes methods and apparatuses for processing microelectronic substrates. Many specific details of certain embodiments of the invention are set forth in the following description and in FIGS. 1A–5 to provide a thorough understanding of these embodiments. One skilled in the art, however, will understand that the present invention may have additional embodiments and that the invention may be practiced without several of the details described below.

Figure 1A:
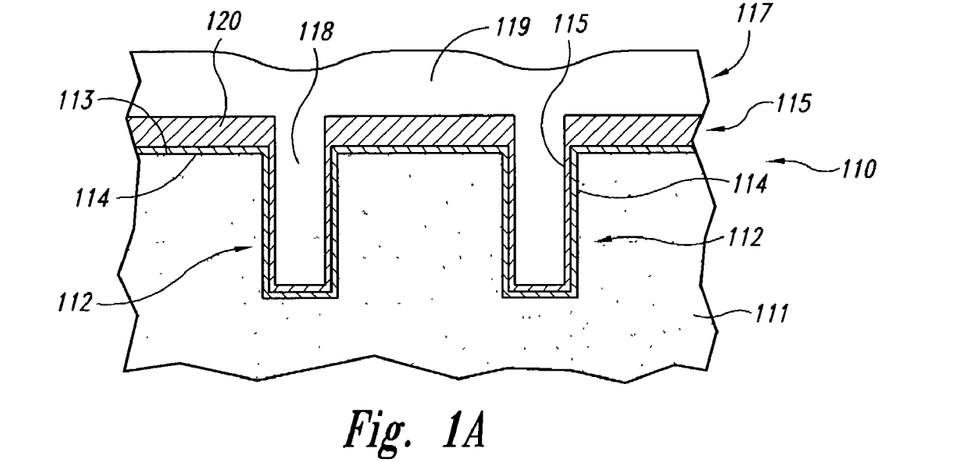
FIGS. 1A–1F schematically illustrate a process for forming features in a microelectronic substrate in accordance with an embodiment of the invention.

FIG. 1A is a partially schematic illustration of a microelectronic substrate 110 positioned for processing in accordance with an embodiment of the invention. In one aspect of this embodiment, the microelectronic substrate 110 includes a substrate material 111, such as borophosphosilicate glass (BPSG), and in other embodiments, the microelectronic substrate 110 can include other substrate materials 111, such as undoped silicon dioxide. In any of these embodiments, one or more apertures 112 (two of which are shown in FIG. 1A) can be formed in a substrate material plane 113 of the substrate material 111, using conventional techniques such as patterned etching. In one embodiment, the apertures 112 have a relatively high aspect ratio (i.e., depth-to-width ratio). For example, in one particular embodiment, the apertures 112 can have an aspect ratio of about 4:1 or more, and in other embodiments, the apertures 112 can have other aspect ratios. In any of these embodiments, an underlayer 114 (such as tantalum or tantalum oxide) can be disposed on the substrate material plane 113 and adjacent to the walls of the apertures 112. The underlayer 114 can be disposed on the microelectronic substrate 110 using conventional techniques, such as physical vapor deposition (PVD) or chemical vapor deposition (CVD). In one aspect of this embodiment, the underlayer 114 can form a barrier layer and in other embodiments, the underlayer 114 can perform other functions, such as promoting adhesion of subsequently deposited materials onto the walls of the apertures 112.

A layer of conductive material 115 is then disposed on the underlayer 114. In one embodiment, the conductive material 115 can include platinum or platinum alloys, and in other embodiments, the conductive material 115 can include other electrically conductive constituents, such as rhodium, ruthenium, copper or alloys of these materials. Platinum may be particularly suitable for apertures 112 having high aspect ratios, such as aspect ratios of approximately 4:1 or more.

A fill material 117 is then disposed on the conductive material 115. The fill material 117 includes subplane portions 118 (positioned beneath the substrate material plane 113 in the apertures 112) and a first external portion 119 that extends outwardly away from the substrate material plane 113, external to the apertures 112. The first external portion 119 is disposed on a second external portion 120 defined by the part of the conductive material 115 located external to the apertures 112 and beyond the substrate material plane 113.

In one embodiment, the fill material 117 can include a relatively hard, generally nonconductive substance, such as phosphosilicate glass (PSG). In a specific aspect of this embodiment, the fill material 117 can include PSG having 6% phosphorous. In other embodiments, the fill material 117 can include other relatively hard PSG or non-PSG materials, such as spin-on glass (SOG). In any of these embodiments, the fill material 117 has a hardness greater than that of a typical photoresist material. Accordingly, in one particular embodiment, the fill material 117 can have a hardness of about 0.04 GPa or higher. In one aspect of this embodiment, the hardness is calculated by driving an indenter with a known geometry into the material and measuring the normal applied force as a function of displacement. In other embodiments, the hardness is calculated in accordance with other methods. In a particular embodiment in which the fill material 117 includes 6% phosphorous PSG, the fill material 117 can have a hardness of about 6.5 GPa or higher. In any of these embodiments, the relatively hard composition of the fill material 117 can resist penetration from particles of the conductive material 115, as described in greater detail below.

Figure 1B:
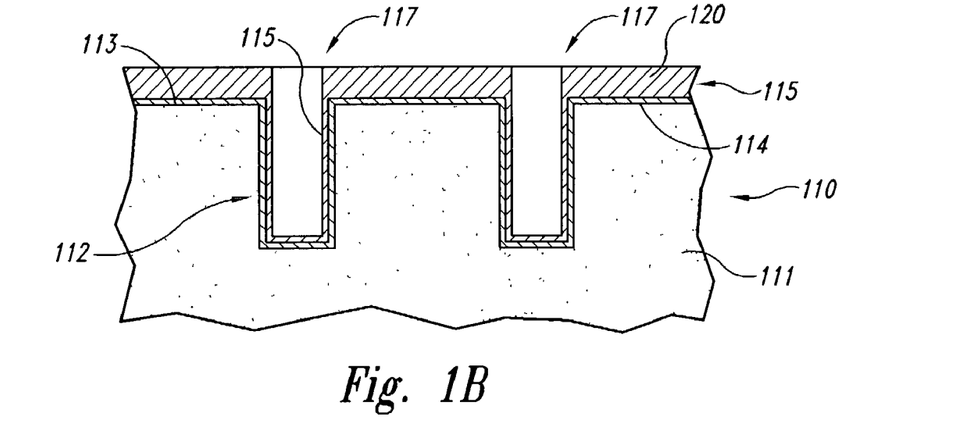

The first external portion 119 of the fill material 117 can be removed (as shown in FIG. 1B) so that the remaining fill material 117 is flush with the conductive material 115. In one aspect of this embodiment, conventional CMP techniques and slurries are used to remove the first projection 119. Apparatuses for removing the first projection 119 are described in greater detail below with reference to FIGS. 2–5.

Figure 1C:
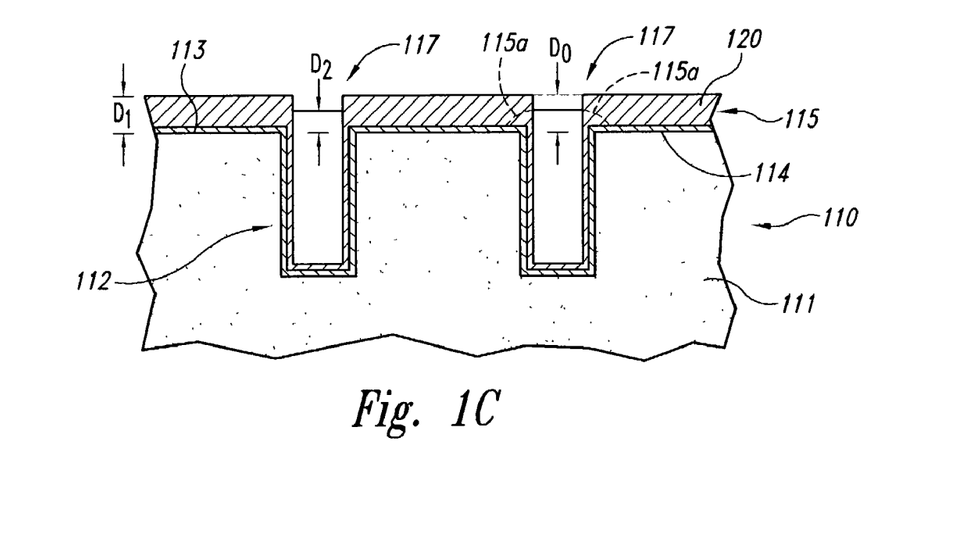

As shown in FIG. 1C, a portion of the remaining fill material 117 can be recessed relative to the adjacent conductive material 115 prior to removing the adjacent conductive material 115. For example, when the conductive material 115 projects away from the substrate material plane 113 by a distance $D_1$, the remaining fill material 117 can project by distance $D_2$ (less than $D_1$) from the substrate material plane 113. In one particular embodiment, where $D_1$ is approximately 1,000 Å, $D_2$ can be from about 200 Å to about 500 Å. In other embodiments, the relative values of $D_1$ and $D_2$ can be different, so long as $D_2$ is less than $D_1$. For example, the recess distance (e.g., $D_1$ minus $D_2$) can be from about 50% to about 80% of $D_1$. In any of these embodiments, selective etch techniques can be used to selectively recess the fill material 117 relative to the adjacent second external portion 120 of the conductive material 115. The second external portion 120 is then removed, as described below.

Figure 1D:
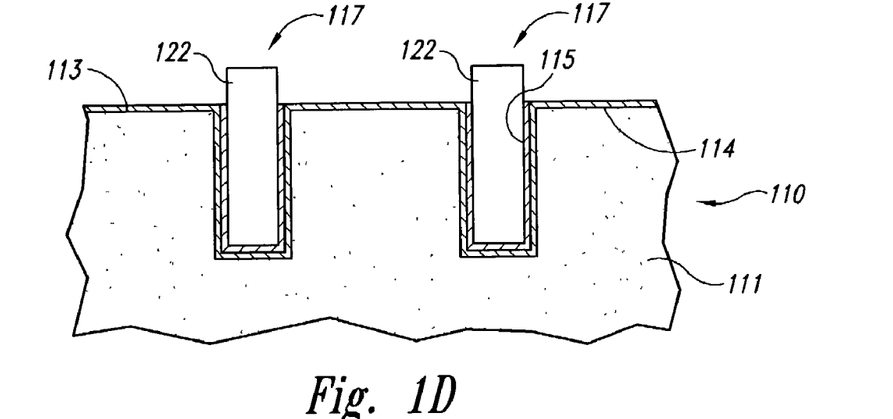

FIG. 1D is a schematic illustration of the microelectronic substrate 110 after the second external portion 120 (FIG. 1C) of the conductive material 115 has been removed. The second external portion 120 can be removed using electrochemical-mechanical polishing (ECMP) techniques and an apparatus generally similar to that described in greater detail below with reference to FIGS. 2–5. In one aspect of this embodiment, the removal of the conductive material 115 is halted upon exposing the underlayer 114. In a further aspect of this embodiment, the conductive material 115 is removed more rapidly than is the fill material 117, so that projections 122 of the fill material 117 extend outwardly from the substrate material plane 113 at the end of this phase of processing. For example, during ECMP processing, the conductive material 115 is removed electrolytically, as well as by chemical and/or mechanical action, whereas the generally nonconductive fill material 117 is removed without electrolytic action. As will be described in greater detail below with reference to FIG. 1E, the projections 122 of the fill material 117 are removed in a subsequent step.

One aspect of an embodiment of the process described above with reference to FIGS. 1C and 1D is that the fill material 117 is recessed relative to the adjacent conductive material 115 by a selected distance prior to removing the adjacent conductive material 115. One advantage of this process is that recessing the fill material 117 can reduce the likelihood for forming residual deposits of conductive material 115 around the apertures 112. For example, if the fill material 117 is flush with the second projection 120 (as indicated by distance $D_0$ in FIG. 1C) when the conductive material 115 is removed, the resulting large mass of fill material 117 extending away from the substrate material plane 113 can "shield" the adjacent conductive material 115 and reduce the effectiveness of the ECMP process for removing the conductive material 115. Accordingly, the process can leave residual deposits 115a of the conductive material 115 around the apertures 112, as shown in dashed lines in FIG. 1D. These deposits, if not removed, can cause short-circuits with adjacent structures, and/or can adversely affect subsequent processing steps. Conversely, if the fill material 117 is recessed substantially lower than the distance $D_2$, the fill material 117 may not adequately support the conducive material 115 within the apertures 112 during the ECMP and CMP processes, causing the conductive material 115 to shear out of the apertures 112 during processing.

Figure 1E:
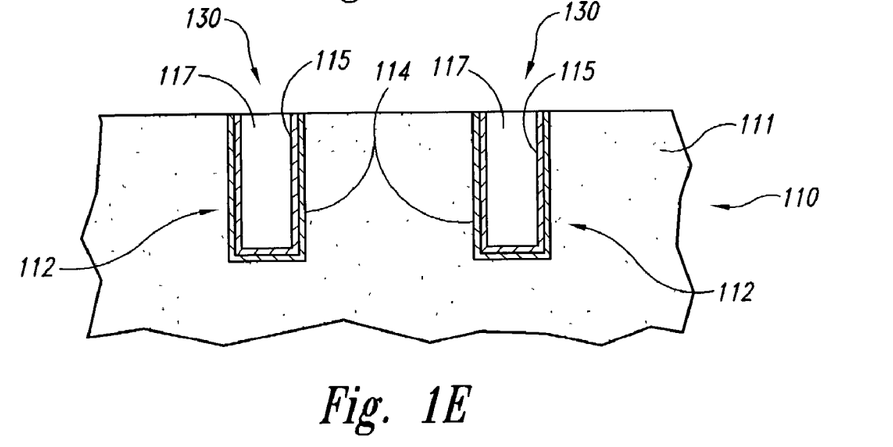

The projections 122 of the fill material 117, along with the portions of the underlayer 114 and the conductive material 115 extending out of the apertures 112, are then removed to form the containers 130, as shown in FIG. 1E. Accordingly, each container 130 includes a volume of fill material 117 surrounded by a layer of conductive material 115, which is in turn surrounded by the underlayer 114. At this point, each container 130 is electrically isolated and shielded from the surrounding structures in the microelectronic substrate 110.

Figure 1F:
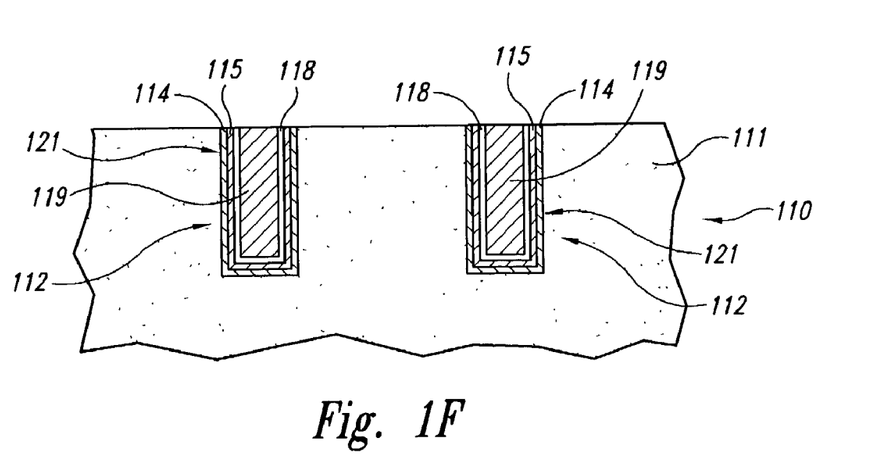

As shown in FIG. 1F, further features (such as electrodes) can next be disposed in the containers 130 to form structures 121 such as capacitors. The features can be disposed in the containers 130 using conventional techniques (such as selective etching and deposition) and are electrically coupled to each other and/or to external contacts with a network of vias and/or lines, also formed with conventional techniques, such as damascene techniques. For example, in one embodiment, the remaining fill material 117 within the apertures 112 is removed. A film 118, formed from a material such as tantalum pentoxide, is then disposed in the apertures 112, and a conductive electrode 119 is disposed adjacent to the film 118 to form the capacitor. In other embodiments, the foregoing techniques can be used to form other features in the microelectronic substrate 110, such as trenches and/or conductive lines. In any of these embodiments, portions of the microelectronic substrate 110 can then be diced from the larger wafer of which they are a part for encapsulation and incorporation in electronic devices.

Figure 2:
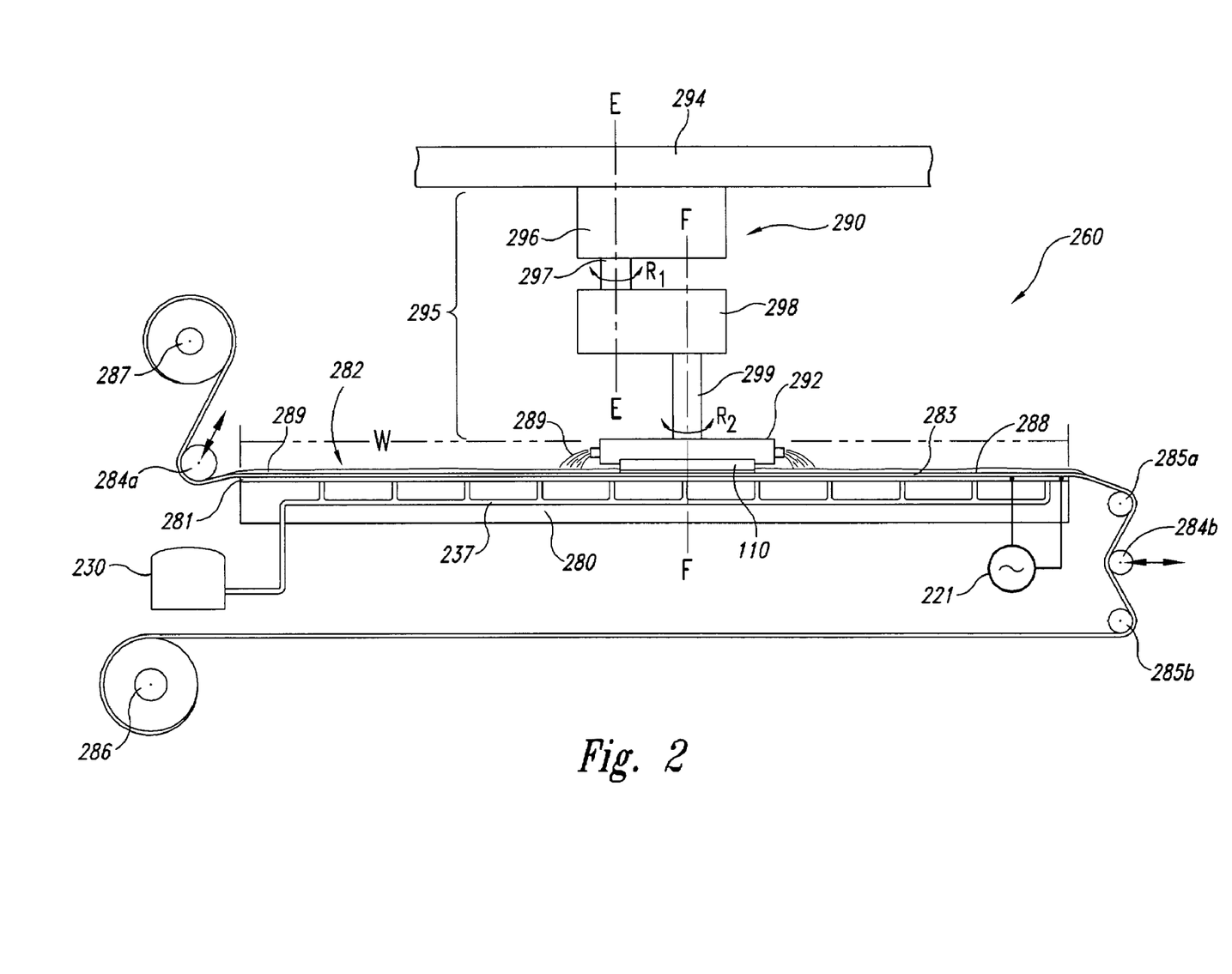
FIG. 2 is a partially schematic illustration of an apparatus for carrying out processes in accordance with embodiments of the invention.

FIGS. 2–5 schematically illustrate apparatuses for processing the microelectronic substrate 110 in a manner generally similar to that described above with reference to FIGS. 1A–1F. For example, FIG. 2 schematically illustrates an apparatus 260 chemically-mechanically and/or electrochemically-mechanically polishing the microelectronic substrate 110 in accordance with an embodiment of the invention. In one aspect of this embodiment, the apparatus 260 has a support table 280 with a top-panel 281 at a workstation where an operative portion "W" of a polishing pad 283 is positioned. The top-panel 281 is generally a rigid plate to provide a flat, solid surface to which a particular section of the polishing pad 283 may be secured during polishing.

The apparatus 260 can also have a plurality of rollers to guide, position and hold the polishing pad 283 over the top-panel 281. The rollers can include a supply roller 287, first and second idler rollers 284a and 284b, first and second guide rollers 285a and 285b, and a take-up roller 286. The supply roller 287 carries an unused or preoperative portion of the polishing pad 283, and the take-up roller 286 carries a used or postoperative portion of the polishing pad 283. Additionally, the first idler roller 284a and the first guide roller 285a can stretch the polishing pad 283 over the top-panel 281 to hold the polishing pad 283 stationary during operation. A motor (not shown) drives at least one of the supply roller 287 and the take-up roller 286 to sequentially advance the polishing pad 283 across the top-panel 281. Accordingly, clean preoperative sections of the polishing pad 283 may be quickly substituted for used sections to provide a consistent surface for polishing and/or cleaning the microelectronic substrate 110.

The apparatus 260 can also have a carrier assembly 290 that controls and protects the microelectronic substrate 110 during polishing. The carrier assembly 290 can include a substrate holder 292 to pick up, hold and release the substrate 110 at appropriate stages of the polishing process. The carrier assembly 290 can also have a support gantry 294 carrying a drive assembly 295 that can translate along the gantry 294. The drive assembly 295 can have an actuator 296, a drive shaft 297 coupled to the actuator 296, and an arm 298 projecting from the drive shaft 297. The arm 298 carries the substrate holder 292 via a terminal shaft 299 such that the drive assembly 295 orbits the substrate holder 292 about an axis E—E (as indicated by arrow "$R_1$"). The terminal shaft 299 may also rotate the substrate holder 292 about its central axis F—F (as indicated by arrow "$R_2$").

The polishing pad 283 and a polishing liquid 289 define a polishing medium 282 that mechanically and/or chemically-mechanically removes material from the surface of the microelectronic substrate 110. The polishing pad 283 used in the apparatus 260 can be a fixed-abrasive polishing pad in which abrasive particles are fixedly bonded to a suspension medium. Accordingly, the polishing solution 289 can be a "clean solution" without abrasive particles because the abrasive particles are fixedly distributed across a polishing surface 288 of the polishing pad 283. In other applications, the polishing pad 283 may be a nonabrasive pad without abrasive particles, and the polishing solution 289 can be a slurry with abrasive particles and chemicals to remove material from the microelectronic substrate 110. To polish the microelectronic substrate 110 with the apparatus 260, the carrier assembly 290 presses the microelectronic substrate 110 against the polishing surface 288 of the polishing pad 283 in the presence of the polishing solution 289. The drive assembly 295 then orbits the substrate holder 292 about the axis E—E and optionally rotates the substrate holder 292 about the axis F—F to translate the substrate 110 across the polishing surface 288. As a result, the abrasive particles and/or the chemicals in the polishing medium 282 remove material from the surface of the microelectronic substrate 110 in a chemical and/or chemical-mechanical polishing process.

In a further aspect of this embodiment, the polishing solution 289 can include an electrolyte for ECMP processing. In another embodiment, the apparatus 260 can include an electrolyte supply vessel 230 that delivers an electrolyte separately to the polishing surface 288 of the polishing pad 283 with a conduit 237, as described in greater detail below with reference to FIG. 3. In either embodiment, the apparatus 260 can further include a current supply 221 coupled to electrodes positioned proximate to the polishing pad 283. Accordingly, the apparatus 260 can electrolytically remove material from the microelectronic substrate 110.

Figure 3:
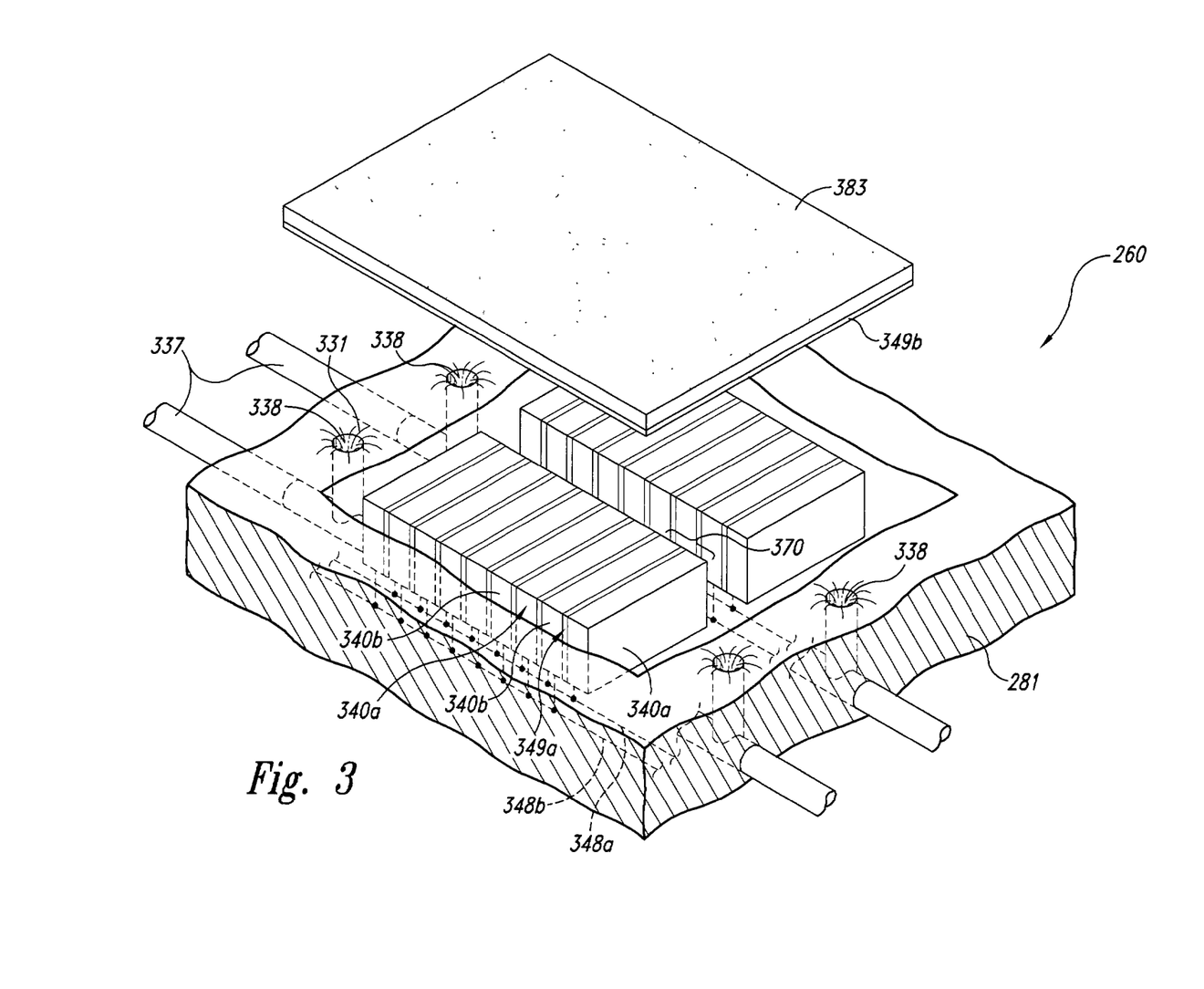
FIG. 3 is a partially schematic, isometric view of a portion of the apparatus shown in FIG. 2 in accordance with an embodiment of the invention.

FIG. 3 is a partially exploded, partially schematic isometric view of a portion of the apparatus 260 described above with reference to FIG. 2. In one aspect of the embodiment shown in FIG. 3, the top-panel 281 houses a plurality of electrode pairs 370, each of which includes a first electrode 340a and a second electrode 340b. The first electrodes 340a are coupled to a first lead 348a and the second electrodes 340b are coupled to a second lead 348b. The first and second leads 348a and 348b are coupled to the current supply 241 (FIG. 2). In one aspect of this embodiment, the first electrodes 340a can be separated from the second electrodes 340b by an electrode dielectric layer 349a that includes Teflon™ or another suitable dielectric material. The electrode dielectric layer 349a can accordingly control the volume and dielectric constant of the region between the first and second electrodes 340a and 340b to control the electrical coupling between the electrodes.

The electrodes 340a and 340b can be electrically coupled to the microelectronic substrate 110 (FIG. 2) by the polishing pad 283. In one aspect of this embodiment, the polishing pad 283 is saturated with an electrolyte 331 supplied by the supply conduits 337 through apertures 338 in the top-panel 281 just beneath the polishing pad 283. Accordingly, the electrodes 320a and 320b are selected to be compatible with the electrolyte 331. In an another arrangement, the electrolyte 331 can be supplied to the polishing pad 283 from above (for example, by disposing the electrolyte 331 in the polishing liquid 289, rather than by directing the electrolyte upwardly through the polishing pad 283). Accordingly, the apparatus 260 can include a pad dielectric layer 349b (FIG. 2) positioned between the polishing pad 283 and the electrodes 340a and 340b. When the pad dielectric layer 349b is in place, the electrodes 340a and 340b are isolated from physical contact with the electrolyte 331 and can accordingly be selected from materials that are not necessarily compatible with the electrolyte 331.

Figure 4:
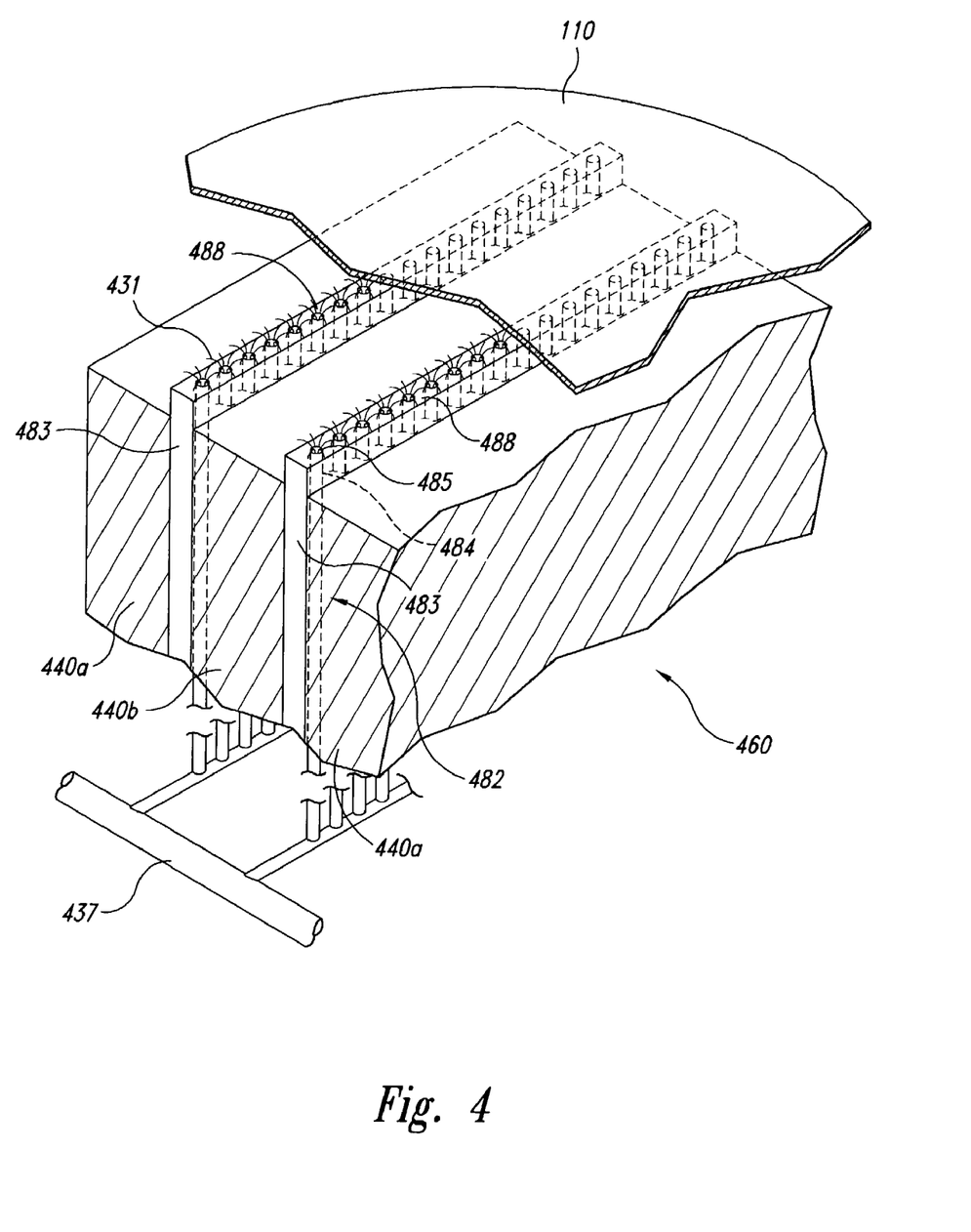
FIG. 4 is a partially schematic, side elevation view of an apparatus for processing a microelectronic substrate in accordance with another embodiment of the invention.

FIG. 4 is an isometric view of a portion of an apparatus 460 having electrodes 440 (shown as a first electrode 440a and a second electrode 440b), and a polishing medium 482 arranged in accordance with another embodiment of the invention. In one aspect of this embodiment, the polishing medium 482 includes polishing pad portions 483 that project beyond the electrodes 440a and 440b. Each polishing pad portion 483 can include a polishing surface 488 and a plurality of flow passages 484 coupled to a fluid source (not shown in FIG. 4) with a conduit 437. Each flow passage 484 can have an aperture 485 proximate to the polishing surface 488 to provide an electrolyte 431 proximate to an interface between the microelectronic substrate 110 and the polishing surface 488. In one aspect of this embodiment, the pad portions 483 can include recesses 487 surrounding each aperture 485. Accordingly, the electrolyte 431 can proceed outwardly from the flow passages 484 while the microelectronic substrate 110 is positioned directly overhead and remains spaced apart from the electrodes 420.

Figure 5:
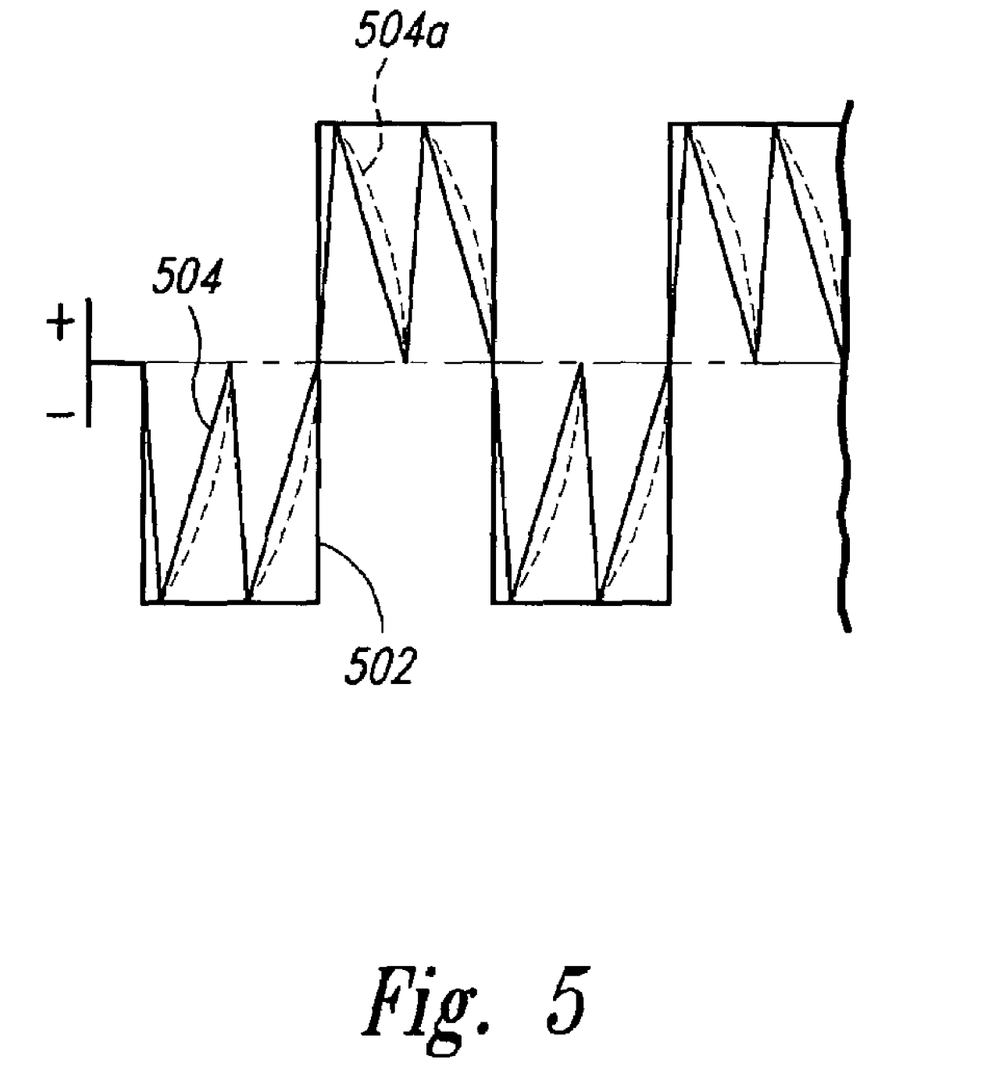
FIG. 5 schematically illustrates a waveform for electrolytically processing a microelectronic substrate in accordance with another embodiment of the invention.

Any of the foregoing apparatuses described above with reference to FIGS. 2–4 can be used to chemically-mechanically process the microelectronic substrate 110, and/or electrochemically-mechanically process the microelectronic substrate 110. When the apparatuses are used to electrochemically-mechanically process the microelectronic substrate 110, they can provide a varying electrical current that passes from the electrodes, through the conductive material of the microelectronic substrate 110, via the electrolytic fluid without contacting the electrodes with the microelectronic substrate 110. For example, as shown in FIG. 5, the apparatus can generate a high-frequency wave 504 and can superimpose a low-frequency wave 502 on the high-frequency wave 504. In one aspect of this embodiment, the high-frequency wave 504 can include a series of positive or negative voltage spikes contained within a square wave envelope defined by the low-frequency wave 502. Each spike of the high-frequency wave 504 can have a relatively steep rise-time slope to transfer charge through the dielectric material to the electrolyte and a more gradual fall-time slope. The fall-time slope can define a straight line, as indicated by high-frequency wave 504, or a curved line, as indicated by high-frequency wave 504a. In other embodiments, the high-frequency wave 504 and the low-frequency wave 502 can have other shapes depending, for example, on the particular characteristics of the dielectric material and the electrolyte, the characteristics of the microelectronic substrate 110, and/or the target rate at which conductive material is to be removed from the microelectronic substrate 110.

From the foregoing, it will be appreciated that specific embodiments of the invention have been described herein for purposes of illustration, but that various modifications may be made without deviating from the spirit and scope of the invention. For example, many of the structures and processes described above in the content of microelectronic containers can also be applied to other microelectronic features. Accordingly, the invention is not limited except as by the appended claims.

We claim:

1. A method for processing a microelectronic substrate, comprising:

forming an aperture in a substrate material plane of a microelectronic substrate;

disposing a conductive material on the microelectronic substrate and in the aperture, the conductive material having a conductive material plane external to the aperture and offset from the substrate material plane;

disposing a fill material on the microelectronic substrate and in the aperture, the fill material having a fill material plane external to the aperture and offset from the substrate material plane and the conductive material plane;

removing at least part of the fill material external to the aperture recessing the fill material inwardly from the conductive material plane toward the aperture;

removing at least part of the conductive material external to the aperture so that the fill material projects away from the aperture beyond the substrate material plane; and disposing a microelectronic feature in the aperture.

2. The method of claim 1, further comprising disposing an underlayer between the conductive material and a wall of the aperture.

3. The method of claim 1 wherein removing at least part of the fill material includes chemically-mechanically polishing the fill material, and wherein removing at least part of the conductive material includes electrochemically-mechanically polishing the conductive material.

4. The method of claim 1 wherein disposing a fill material includes disposing a fill material with a hardness of about 0.04 GPa or higher.

5. The method of claim 1 wherein disposing a fill material includes disposing a fill material with a hardness of about 6.5 GPa or higher.

6. The method of claim 1 wherein removing the conductive material includes:

positioning first and second electrodes proximate to and spaced apart from the conductive material;

contacting the conductive material with a polishing medium;

disposing an electrolyte between the electrodes and the conductive material; and moving at least one of the microelectronic substrate and the electrodes relative to the other while passing a varying current through the electrodes.

7. The method of claim 1 wherein recessing the fill material includes recessing the fill material until the fill material extends outwardly from the substrate material plane by a distance of from about 200 Å to about 500 Å.

8. The method of claim 1 wherein recessing the fill material includes recessing the fill material from the conductive material plane by from about 50% to about 80% of a thickness of the conductive material.

9. The method of claim 1 wherein forming an aperture in a substrate material plane includes forming an aperture having an aspect ratio of about 4:1 in a borophosilicate glass material.

10. A method for processing a microelectronic substrate, comprising:

providing a microelectronic substrate having a substrate material defining a substrate material plane, a conductive material proximate to the substrate material, and a generally nonconductive fill material disposed proximate to the conductive material with the conductive material between the substrate material and the generally non-conductive fill material, wherein a portion of the generally non-conductive fill material includes a first external portion projecting beyond the substrate material plane, and wherein a portion of the conductive material includes a second external portion projecting beyond the substrate material plane;

removing at least part of the first external portion extending beyond the second external portion;

recessing the fill material inwardly toward the substrate material plane;

removing at least part of the second external portion; and removing at least part of the conductive material external to the aperture so that the fill material projects away from the aperture beyond the substrate material plane.

11. The method of claim 10 wherein providing a microelectronic substrate includes-providing a microelectronic substrate having an aperture in the substrate material plane, an underlayer adjacent to a wall of the aperture, and the conductive material adjacent to the underlayer.

12. The method of claim 10 wherein removing at least part of the first external portion includes chemically-mechanically polishing the first external portion, and wherein removing at least part of the second external portion includes electrochemically-mechanically polishing the second external portion.

13. The method of claim 10 wherein removing at least part of the second external portion includes removing the conductive material at least until the conductive material is approximately flush with the substrate material plane.

14. The method of claim 10 wherein providing a microelectronic substrate includes providing a microelectronic substrate having a fill material with a hardness of about 0.04 GPa or higher.

15. The method of claim 10 wherein providing a microelectronic substrate includes providing a microelectronic substrate having a fill material with a hardness of about 6.5 GPa or higher.

16. The method of claim 10 wherein providing a microelectronic substrate includes providing a microelectronic substrate having an aperture with a platinum lining.

17. The method of claim 10 wherein removing at least part of the first external portion includes contacting the first external portion with a polishing medium and moving at least one of the microelectronic substrate and the polishing medium relative to the other.

18. The method of claim 10 wherein removing the second external portion includes removing the second external portion by electrochemical-mechanical polishing.

19. The method of claim 10 wherein removing the second external portion includes:

positioning first and second electrodes proximate to and spaced apart from the second external portion;

contacting the second external portion with a polishing medium;

disposing an electrolyte between the electrodes and the second external portion; and moving at least one of the microelectronic substrate and the electrodes relative to the other while passing a varying current through the electrodes.

20. The method of claim 10 wherein recessing the first external portion includes recessing the first external portion until the first external portion extends outwardly from the substrate material plane by a distance of from about 200 Å to about 500 Å.

21. The method of claim 10 wherein providing a microelectronic substrate having a second external portion includes providing a microelectronic substrate having a second external portion that projects by about 1000 Å beyond the substrate material plane, and wherein recessing the first external portion includes recessing the first external portion until the first external portion extends outwardly from the substrate material plane by a distance of from about 200 Å to about 500 Å.

22. The method of claim 10 wherein providing a microelectronic substrate includes providing a microelectronic substrate having a borophosphosilicate glass substrate material with an aperture having an aspect ratio of about 4:1.

23. A method for processing a microelectronic substrate, comprising:

providing a microelectronic substrate having a substrate material with a substrate material plane, an aperture in the substrate material plane, an underlayer lining the aperture, a platinum layer adjacent to the underlayer, and a phosphosilicate glass fill material disposed in the aperture adjacent to the platinum layer, wherein a portion of the fill material includes a first external portion projecting beyond the aperture, and wherein a portion of the platinum layer includes a second external portion projecting beyond the aperture;

chemically-mechanically polishing the microelectronic substrate to remove at least part of the first external portion extending beyond the second external portion;

recessing the first external portion inwardly toward the aperture from the second external portion by etching the first external portion until the first external portion extends by from about 200 Å to about 500 Å beyond the substrate material plane;

removing the second external portion using electrochemical-mechanical polishing so that the fill material projects away from the aperture beyond the substrate material plane; and disposing a microelectronic feature in the aperture.

24. The method of claim 23 wherein disposing a microelectronic feature includes disposing an electrode, and wherein the method further comprises removing the fill material from the aperture prior to disposing the electrode in the aperture.

25. The method of claim 23 wherein providing a microelectronic substrate includes providing a microelectronic substrate having an aperture with an aspect ratio of about 4:1 or more.

26. The method of claim 23 wherein disposing a microelectronic feature includes disposing an electrode.

27. The method of claim 23, further comprising making the fill material flush with the substrate material plane by removing portions of the underlayer, the conductive material and the fill material external to the aperture.

28. The method of claim 23 wherein providing a microelectronic substrate includes providing a microelectronic substrate with a second external portion projecting by a distance of about 1000 Å beyond the substrate material plane.

* * * * *